United States Patent
Cader et al.

(10) Patent No.: US 10,842,053 B2
(45) Date of Patent: Nov. 17, 2020

(54) ELECTRONIC COMPONENT COOLING

(71) Applicant: Hewlett Packard Enterprise Development LP, Houston, TX (US)

(72) Inventors: Tahir Cader, Spokane, WA (US); Matthew Slaby, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/479,391

(22) Filed: Apr. 5, 2017

(65) Prior Publication Data

US 2018/0295744 A1    Oct. 11, 2018

(51) Int. Cl.
*H05K 7/20* (2006.01)
*G06F 1/20* (2006.01)

(52) U.S. Cl.
CPC .......... *H05K 7/20781* (2013.01); *G06F 1/20* (2013.01); *G06F 2200/201* (2013.01)

(58) Field of Classification Search
CPC .......... H05K 7/20272; H05K 7/20254; H05K 7/20836; H05K 7/20789; H05K 7/2079
See application file for complete search history.

(56) References Cited

U.S. PATENT DOCUMENTS

| | | | |
|---|---|---|---|
| 6,374,627 B1 | 4/2002 | Schumacher | |
| 7,554,323 B2 | 6/2009 | Pfahnl | |
| 8,522,569 B2* | 9/2013 | Avery | F25B 27/02 62/238.6 |
| 8,982,552 B2* | 3/2015 | Roesner | G06F 13/14 361/679.47 |
| 9,167,721 B2* | 10/2015 | Campbell | H05K 7/20281 |
| 2011/0239671 A1 | 10/2011 | Malone | |
| 2013/0205822 A1* | 8/2013 | Heiland | H05K 7/2079 62/259.2 |
| 2013/0264045 A1* | 10/2013 | Chainer | H05K 7/20836 165/287 |
| 2014/0060798 A1 | 3/2014 | Eckberg | |

FOREIGN PATENT DOCUMENTS

CN    103884050    6/2014

OTHER PUBLICATIONS

Coles, H., "A Unique Approach to Data Center Cooling", Data Center Dynamics the Business of Data Centers, Apr. 5, 2013, 6 pages.

* cited by examiner

*Primary Examiner* — Mukundbhai G Patel
(74) *Attorney, Agent, or Firm* — Hewlett Packard Enterprise Patent Department

(57) ABSTRACT

An example apparatus is provided herein. The apparatus includes a coolant distribution unit and a liquid cooled sub-ambient unit. The coolant distribution unit provides a liquid to a set of liquid cooled cold plates to cool a first electronic component. The liquid cooled sub-ambient unit provides air to cool a second electronic component.

19 Claims, 6 Drawing Sheets

ELECTRONIC COMPONENT COOLING

BACKGROUND

Electronic devices have power and temperature requirements. Power for the electronic devices may be provided from available resources. The power needed includes resources to power electronic devices and provide power to systems that control the temperature of the electronic devices.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs balance conflicts between power density, spatial layout, temperature requirements, acoustic noise, and other factors on the electronic devices. Reduction of power usage effectiveness (PUE) is important to many customers. Cooling of electronic components may be controlled using cooling systems incorporated into the electronic device and environment surrounding the electronic devices. Examples of cooling systems include air and liquid cooling components.

In examples, a cooling apparatus is provided. The apparatus includes a coolant distribution unit, a liquid cooled sub-ambient unit, a liquid supply line and a liquid return line. The coolant distribution unit provides a liquid to a liquid cooling apparatus, such as a set of liquid cooled cold plates, to cool a first electronic component. The liquid cooled sub-ambient unit provides air to cool a second electronic component. The liquid supply line supplies the coolant distribution unit and the liquid cooled sub-ambient unit liquid from one facility supply source. The liquid return line receives liquid from the coolant distribution unit and the liquid cooled sub-ambient unit. Cooling systems that are designed to handle inlet liquid or water temperatures of greater than 35° C. and return liquid or water between to 40° C.-50° C. provide solutions to meet the needs of more customers because the solution does not mechanically chill the liquid or water prior to use and is able to maximize the reuse of waste heat.

Figure 1:
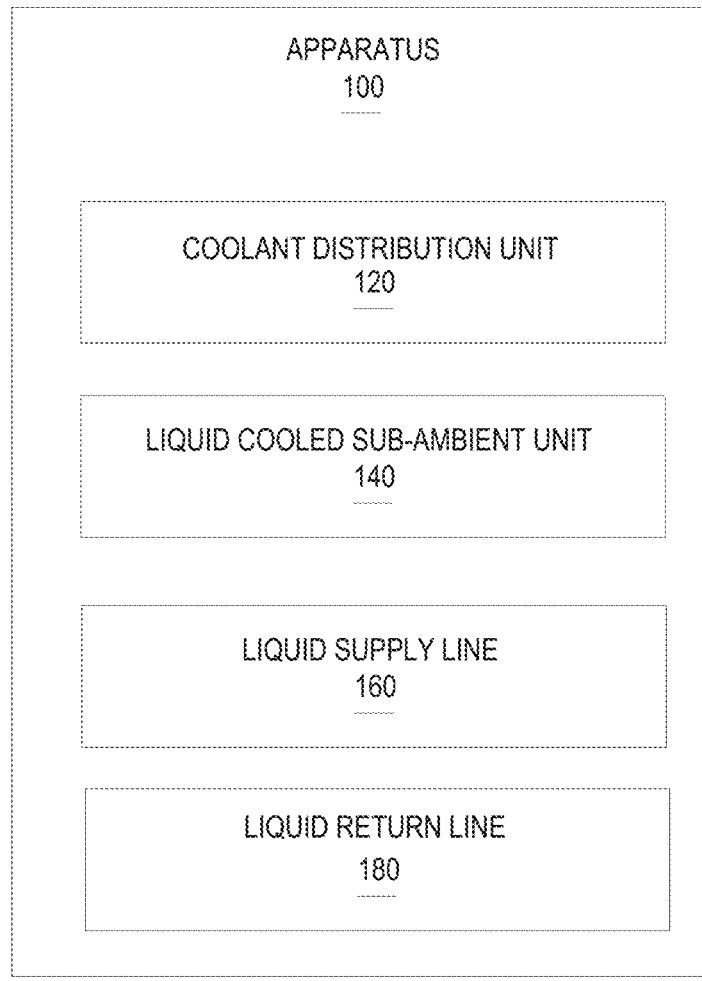
FIGS. 1-2 illustrate block diagrams of apparatuses to cool a set of electronic components according to examples.
Figure 2:
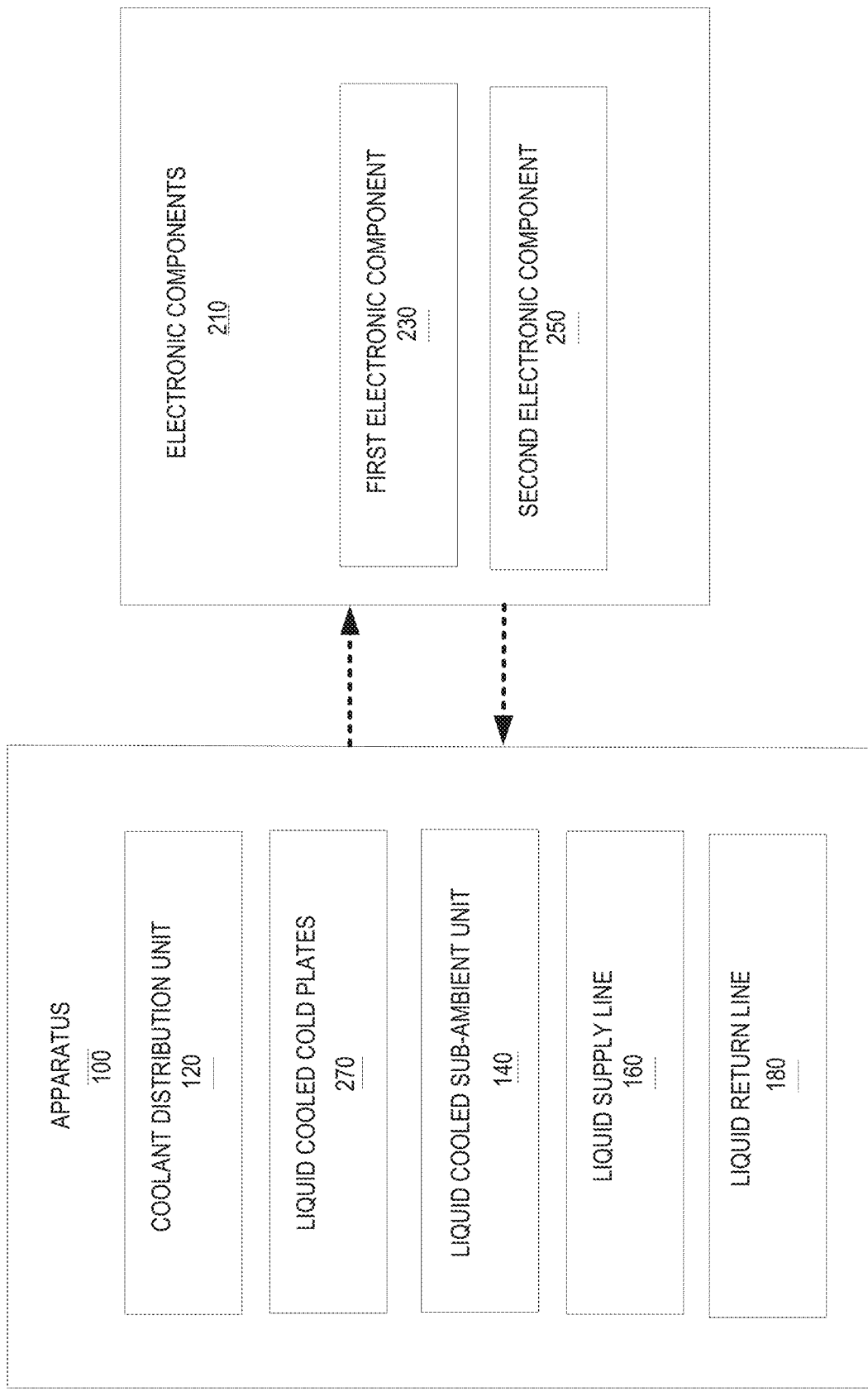

FIGS. 1-2 illustrate block diagrams of apparatuses to cool a set of electronic components according to examples. The apparatuses include a coolant distribution unit (CDU) 120, a liquid cooled sub-ambient unit 140, a liquid supply line 160 and a liquid return line 180. The coolant distribution unit 120 provides a liquid to a set of liquid cooled cold plates 270 to cool a first electronic component 230. The first electronic component 230 includes, for example, at least one of a central processing unit (CPU), a graphics processing unit (GPU), or dual in-line memory modules (DIMMs). The liquid cooled sub-ambient unit 140 provides air to cool a second electronic component 250. The second electronic component 250 includes, for example, at least one air cooled component selected from blades, racks, network switches and other electronic components, such as power supplies, hard drives, voltage regulators, peripheral component interconnect express (PCIe) cards, resistors, and/or chipsets, not cooled using the set of liquid cooled cold plates 270 such that the first electronic component and the second electronic component may be distinct electronic components. Alternatively, the CPU, GPU, and/or DIMMs may be cooled using both the liquid cooling apparatus and air cooled solutions. The liquid supply line 160 provides the coolant distribution unit 120 and the liquid cooled sub-ambient unit 140 liquid from one facility supply source. The liquid return line 180 receives liquid from the coolant distribution unit 120 and the liquid cooled sub-ambient unit 140.

Figure 3:
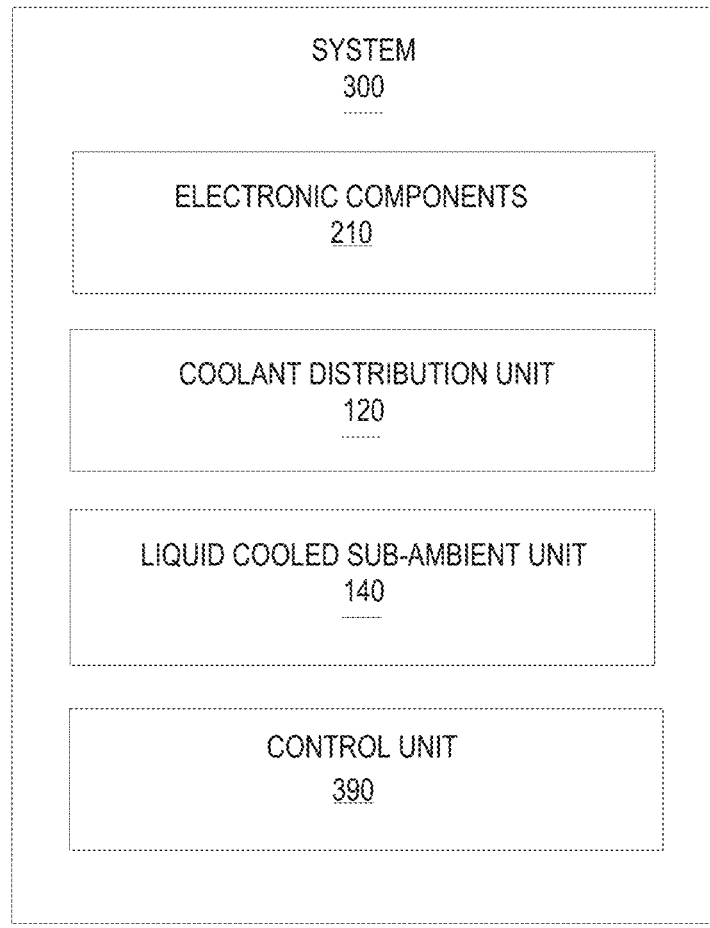
FIG. 3 illustrates a block diagram of a system to manage cooling of the set of electronic components according to an example.

FIG. 3 illustrates a block diagram of a system 300 to manage cooling of the set of electronic components according to an example. The system 300 includes a set of electronic components 210, a coolant distribution unit 120, a liquid cooled sub-ambient unit 140, and a control unit 390. The coolant distribution unit 120 with at least one liquid cooled cold plate to cool at least a first electronic component of the set of electronic components using liquid distributed to the at least one liquid cooled cold plate. The liquid cooled sub-ambient unit 140 provides air to cool a second electronic component of the set of electronic components. The control unit 390 is connected to the coolant distribution unit 120, the liquid cooled sub-ambient unit 140, and/or an information technology (IT) rack 402 to coordinate cooling and workload of the set of electronic components with settings of the coolant distribution unit 120 and the liquid cooled sub-ambient unit 140.

Figure 4:
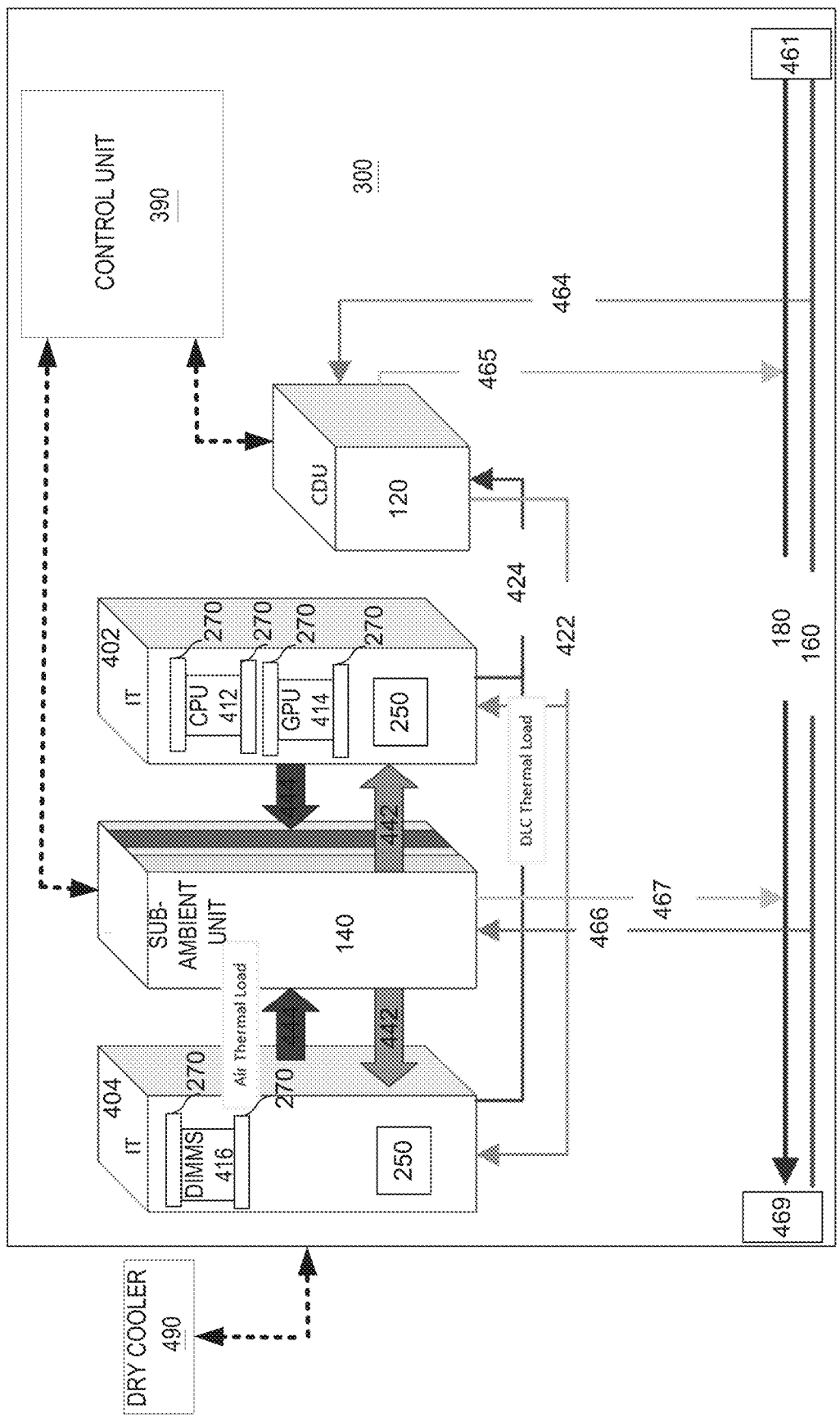
FIG. 4 illustrates a schematic diagram of the system of FIG. 3 according to an example.

FIG. 4 is a schematic diagram of the system 300 of FIG. 3 according to an example. For example, a system 300 that is part of a data center with two IT racks 402, 404 is illustrated in FIG. 4. A coolant distribution unit 120, a liquid cooled sub-ambient unit 140, a liquid supply line 160, and a control unit 390 are also provided. The coolant distribution unit 120 is illustrated as connected to a CDU liquid supply line 422 to the IT racks 402, 404. The liquid is distributed within each IT rack 402, 404 to the cold plate 270 that removes heat from the first set of electronic components 230. As discussed above, the first electronic component 230 includes, for example, at least one of a central processing unit, a graphics processing unit, or a dual in-line memory modules. The liquid cooled cold plate 270 may be used to provide board level liquid cooling to the first electronic component. The waste heat is then carried out from the IT racks 402, 404 with the liquid via the CDU liquid return line 424. The coolant distribution unit 120 then cools the liquid and sends it back to the liquid cooled cold plate 270 to repeat or continue the cooling of the first electronic component 230. For example, the coolant distribution unit cools liquid from the liquid cooled cold plate by removing heat from the liquid and redistributing cooled liquid back to the liquid cooled cold plate to continue cooling the first electronic component. This process may also be described as thermal conditioning.

The liquid cooled sub-ambient unit 140 receives liquid from the facility supply via the sub-ambient unit facility supply 466. The liquid cooled sub-ambient unit 140 uses the liquid to provide row cooling to the second electronic component. For example, the liquid cooled sub-ambient unit 140 may include air cooling above the row, in a mechanical room, or as an in-row cooling device. An example of an in-row cooling device includes a direct expansion device that provides an air-to-liquid heat exchanger to transfer heat from the air to a refrigerant, thereby cooling the air and delivering it to the IT racks 402, 404. The air flows from the liquid cooled sub-ambient unit 140 to the IT racks 402, 404 to cool the second component, such as components that are not cooled with a cold plate 270. Then, the air that captures the heat from the second electronic components 250 is returned to the liquid cooled sub-ambient unit 140. The heat in the air is transferred to the refrigerant. In turn, the refrigerant transfers heat to the facility water, which transports the heat out of the data center via the sub-ambient unit facility return 467 that is connected to the facility return 180.

The purpose of the liquid cooled sub ambient unit 140 in the system 300 is to provide cooler airflow than the facility water; thus, enabling customers with warmer facility water to cool air-cooled IT components with temperatures below their facility water temperature. The system 300 as a whole with CDU 120 and liquid cooled sub-ambient unit 140, such as an in-row cooler, allows for cooling dense conventional IT with warmer facility water than would normally be possible. The in-row heat exchanger unit takes care of the air cooled portion that needs the cooler air and the CDU 120 cools the rest of the electronic components, e.g., first electronic component that does not need the cooler temperatures. Using the in-row heat exchanger unit to only cool the minimum portion of the IT that requires cooler temperatures, in combination with the liquid-cooled cold plate, saves energy in comparison to a system hat air cools all of the IT.

The liquid supply line 160 supplies liquid from a single facility supply source 461 to both the coolant distribution unit 120 and a liquid cooled sub-ambient unit 140. The liquid may be provided to the coolant distribution unit and the liquid cooled sub-ambient unit via a liquid supply line in parallel or in series. For example, the liquid is supplied to the coolant distribution unit 120 via the coolant distribution unit (CDU) facility supply 464, and the liquid is supplied to the liquid cooled sub-ambient unit 140 via the sub-ambient unit facility supply 466. Similarly, there may be a single facility return source 469. The liquid may then be returned to the facility return 180 via the CDU facility return 465 and the sub-ambient unit facility return 467. The CDU facility return 465 allows the system to recapture liquid from the at least one liquid cooled cold plate 270 or recapture heat via liquid-to-liquid heat exchanger, and the sub-ambient unit facility return 467 allows the system to recapture liquid from the liquid cooled sub-ambient unit 140. The captured heat from the liquid cooled sub-ambient unit 140 and/or the at least one liquid cooled cold plate 270 may be used as an energy source for a facility connected to the data center. The control unit 390 is connected to the set of electronic components to coordinate the operation of the coolant distribution unit 120 and the liquid cooled sub-ambient unit 140. The control until 390 may coordinate workloads of the set of electronic components using, for example, the settings of the coolant distribution unit 120, the liquid cooled sub-ambient unit 140, or a combination of both. The control unit 390 can also coordinate the liquid provided to and received from the coolant distribution unit 120 and the liquid cooled sub-ambient unit 140 via the liquid supply line 160 and the liquid return line 180. The control unit 390 can manage the operational set points of the coolant distribution unit 120, the liquid cooled sub-ambient unit 140, the IT racks 402, 404, the liquid supply line 160 and the liquid return line 180 and dynamically tune the system to achieve the highest possible liquid (e.g. water) return temperature. For example, the coolant distribution unit 120 discharge temperatures can be increased or decreased to change the overall heat capture ratio of the direct liquid cooling of the liquid cooled cold plate. The discharge pressure can also be altered to adjust the amount of load the direct liquid cooling of the liquid cooled cold plate removes. Similarly, the liquid cooled sub-ambient unit 140 discharge temperatures and airflow may be dynamically adjusted. The adjustments to the coolant distribution unit 120 and the liquid cooled sub-ambient unit 140 temperatures and pressures may allow for the output of warmer facility liquid when the electronic component load is low. During low loads, the coolant distribution unit 120 can lower the pump speed and increase the electronic component supply temperature at the same time the liquid cooled sub-ambient unit 140 set point may be increased, which in turn will increase the facility liquid or water return temperature. When load increases the set points can be returned to previous set points.

The facility that houses the system 300 may further include a dry cooler 490 connected to it. The dry cooler 490 may handle rejected heat from the coolant distribution unit 120 and the liquid cooled sub-ambient unit 140 by releasing the heat into the atmosphere outside the facility. Use of the dry cooler 490 may reduce the liquid consumption of the system 300 or facility since the heat that is rejected is released instead of being cooled using a chiller that would use more power or a water tower that would use a source of water for evaporative cooling. The dry cooler 490 provides a low energy, no water usage, cooling method to move heat from the facility liquid or water loop to the atmosphere. A dry cooler 490 alone has not been used in many cases because the dry cooler does not provide facilities with liquid or water temperatures as low in certain climates as the chiller or water tower options; however, use of the coolant distribution unit 120 and liquid cooled sub-ambient unit 140 provided in system 300, enables the use of high liquid or water temperatures and makes use of a dry cooler 490 a viable option in more climates around the world.

Figure 5:
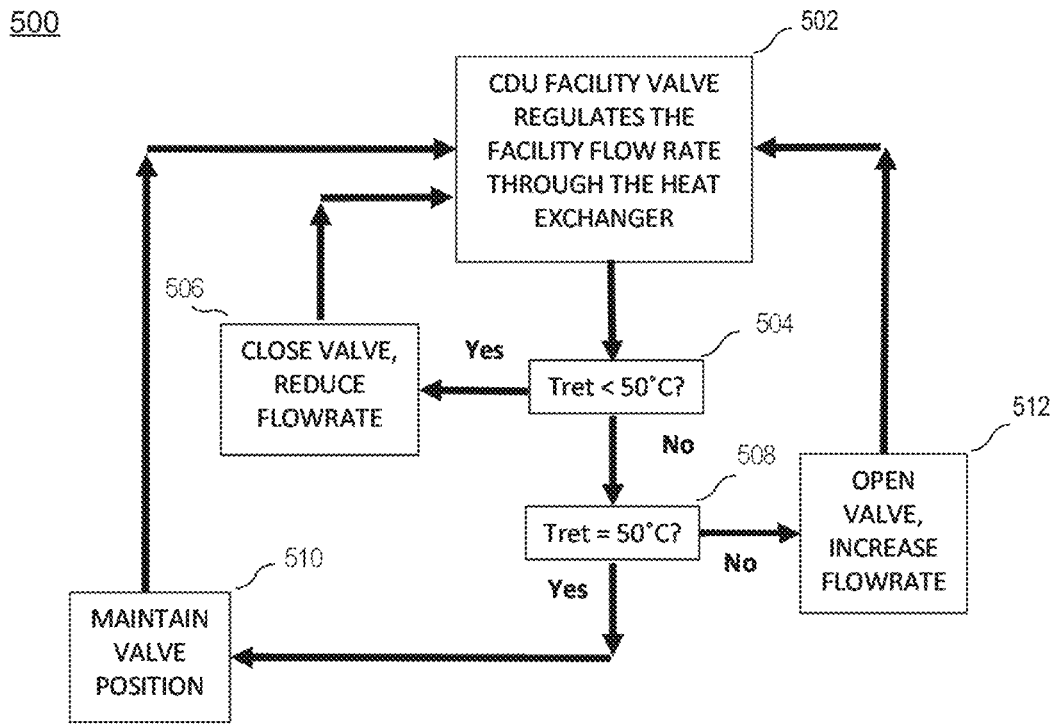
FIGS. 5-6 illustrate flow charts of methods to optimize facility return temperatures in a system of FIG. 3 according to examples.
Figure 6:
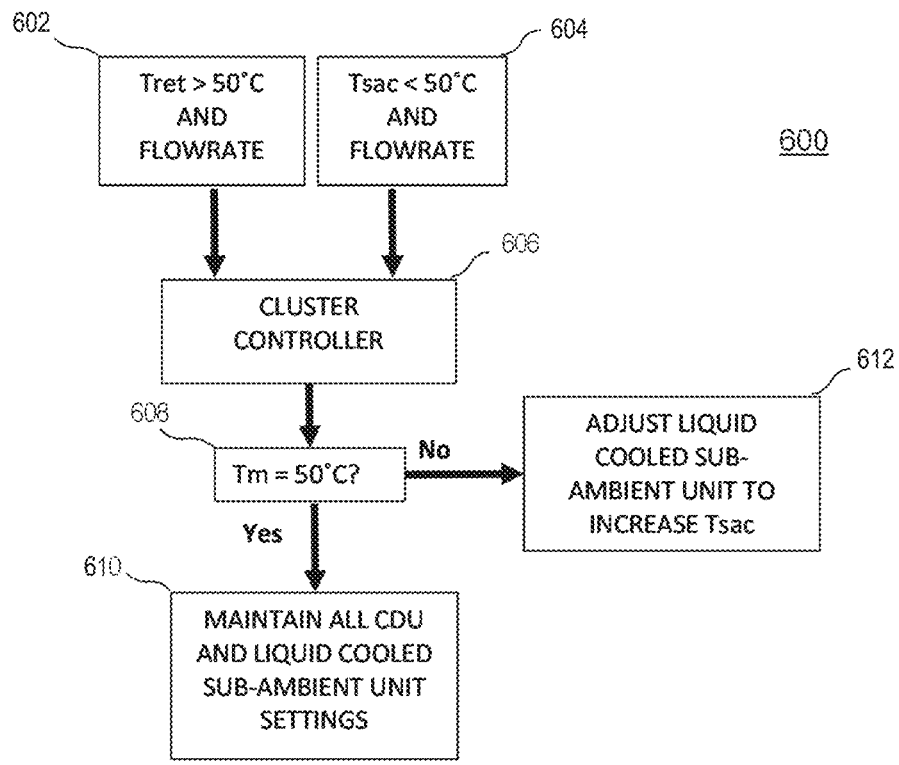

FIGS. 5-6 illustrate flow charts of methods to optimize facility return temperatures in a system of FIG. 3 according to examples. The methods are particularly useful in northern climates where hot water can be used to heat buildings. The control unit 390 of FIG. 3 may be used to coordinate settings of the coolant distribution unit 120 and the liquid cooled sub-ambient unit 140 using, for example, a coolant distribution unit (CDU) controller and/or a cluster controller. Referring to FIG. 5, the flow chart 500 represents partial functionality of the CDU controller and the coolant distribution unit facility valve. FIG. 6 illustrates a representation of the partial functionality of the cluster controller and its interaction with the CDU and sub-ambient cooler facility valves. The valves used for FIGS. 5-6 are for illustrative purposes only.

A given IT load is assumed for both FIGS. 5-6. FIG. 5 provides at least one way in which the CDU controller will maintain the facility return water temp, Tret, at a given set-point. For illustrative purposes, we specify Tret equals 50° C. as the set-point temperature for the system. The flow chart 500 illustrates in block 502 the CDU facility valve to regulate the facility flow rate through a heat exchanger. Then, the flow chart 500, checks to see if the set-point temperature is met for the system. If the facility return water temp, Tret is less than 50° C. in block 504, the CDU facility valve is incrementally closed to reduce the flowrate in block 506. The CDU facility valve reduces the facility flow rate through the heat exchanger in block 502. The CDU facility valve will continue closing until Tret equals 50° C. If the facility return water temperature, Tret is not less than 50° C. in block 504, then, the flow chart 500 checks to see if the facility return water temperatures, Tret is equal to 50° C. in 508. When the Tret is equal to 50° C., the current valve position is maintained in block 510 and the CD facility valve continues to regulate the facility flow rate through the heat exchanger in block 502 with the current flow rate. When the Tret is not less than or equal to 50° C., as determined in blocks 504 and 508, or in other words greater than 50° C., then the CDU facility valve is incrementally opened to increase the flowrate in block 512, to enable the CDU facility valve to increase the facility flowrate, so that Tret can drop to the set-point of 50° C. regulate the facility flow rate through the heat exchanger in block 502 and continue the optimization using the flow chart 500. The flow chart 500 works regardless of the set-point temperature. While the process is described using temperature, the flow chart 500 with different set-points may be used to control pressure drops and other variables.

System 300 contemplates the use of one or more coolant distribution units 120 in conjunction with one or more liquid cooled sub-ambient units 140, also referred to as sub-ambient coolers. As a result, a cluster controller may be used to control the simultaneous operation of the coolant distribution unit(s) 120 and the liquid cooled sub-ambient unit(s) 140 in order to maintain the temperature of water returning to the facility at its set-point temperature. For example, FIG. 6 includes a flow chart 600 illustrating use of the cluster controller with the temperature of the water returning to the facility referred to as Tm, a mixture of Tret from the coolant distribution unit and Tsac, temperature of water from the liquid cooled sub-ambient unit. In block 606, the cluster controller receives information from the coolant distribution unit, such as Tret and the water flowrate of block 602, and information from the liquid cooled sub-ambient unit, such as Tsac and flowrate of block 604. The cluster controller in block 606 calculates the water mixture temp, Tm. Then, in block 608, the cluster controller checks to see if Tm is equal to 50° C., the designated set-point for this example. When Tm is equal to the set-point, i.e., 50° C., the settings of the coolant distribution unit and liquid cooled sub-ambient unit are maintained. If Tm is not equal to 50° C., since Tret 50° C. and Tsac<50° C., the Cluster Controller can make a number of decisions, including 1) instruct the coolant distribution unit to shut its facility valve to further increase Tret to the point that Tm equals 50° C.; 2) instruct the liquid cooled sub-ambient unit to shut its facility valve to further increase Tsac to the point that Tm equals 50° C.; and 3) instruct both the coolant distribution unit and liquid cooled sub-ambient unit to adjust until the Tm equals 50° C. These three examples are provided but there are a number of permutations that may be executed upon. The choice of instructions will depend on threshold operating points, such as the temperatures, flowrates, pressure of the coolant distribution unit and liquid cooled sub-ambient unit. For example, the coolant distribution unit would not want to increase Tret to the point that the temp of the water supplied to the IT exceeds its set-point temperature.

Figure 7:
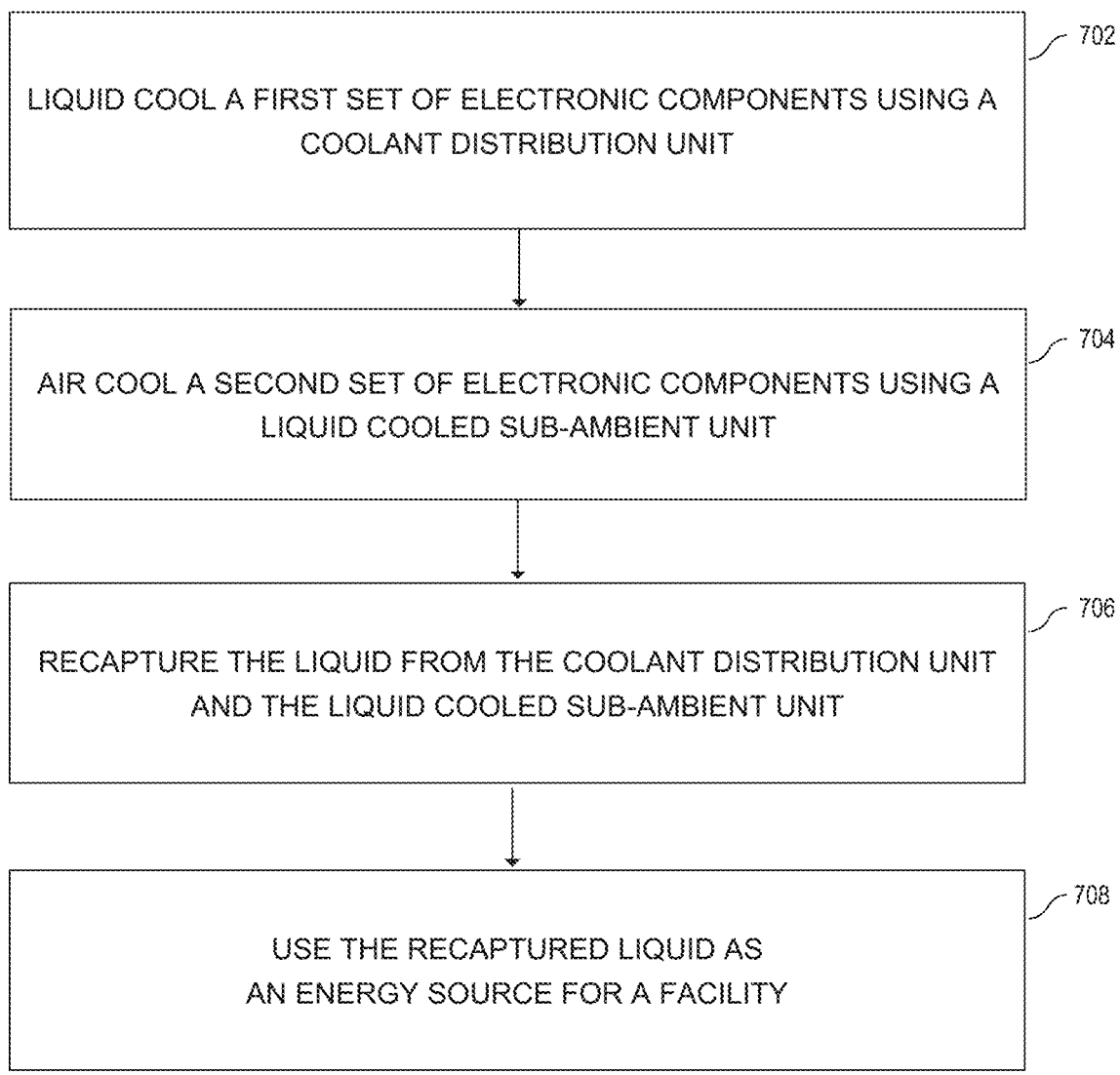
FIG. 7 illustrates a flow chart of a method to cool electronic components and recapture liquid in a data center according to an example.

FIG. 7 illustrates a flow chart 700 of a method to cool electronic components and recapture liquid in a data center according to an example. In block 702, a first set of electronic components are liquid cooled using a coolant distribution unit. For example, the coolant distribution unit may be connected to at least one liquid cooled cold plate. A second set of electronic components are air cooled using a liquid cooled sub-ambient unit in block 704. The liquid is provided to the coolant distribution unit, for example, via the at least one liquid cooled cold plate, and the liquid cooled sub-ambient unit via a liquid supply line that provides one stream of liquid from the facility. For example, the liquid cooled cold plate and the liquid cooled sub-ambient unit may receive the liquid of 45° C. or even higher in some circumstances. The liquid from the coolant distribution unit, for example via at least one of the liquid cooled cold plates, and the liquid cooled sub-ambient unit is recaptured in block 706. In block 708, the recaptured liquid that is heated is used as an energy source for a data center and/or the facility that houses the data center. A dry cooler may also be provided to handle rejected heat from the coolant distribution unit and the liquid cooled sub-ambient unit by releasing the heat into the atmosphere outside the facility.

FIG. 7 provides a flow diagram 700 illustrating a method to cool electronic components and recapture liquid in a data center, according to an example. Although execution of process 700 is described above with reference to system 300, other suitable systems and/or devices for execution of method 700 may be used. For example, processes described below as being performed by system 300 may be performed by control unit 390 and/or any other suitable device or system. Although the flow diagram of FIG. 7 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described may occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

The invention claimed is:

1. An apparatus comprising:
a coolant distribution unit that provides liquid at an ambient temperature to a set of liquid cooled cold plates to cool a first electronic component, the coolant distribution unit having a coolant distribution unit facility liquid return line with a return liquid temperature;
a liquid cooled sub-ambient unit that provides air at a sub-ambient temperature, using a direct expansion device that provides an air-to-liquid heat exchanger to transfer heat from the air to a refrigerant, to cool a second electronic component, the liquid cooled sub-ambient unit having a sub-ambient unit facility liquid return line with a sub-ambient unit liquid temperature;
a liquid supply line that provides the coolant distribution unit and the liquid cooled sub-ambient unit liquid from a facility supply source;
a liquid return line that receives liquid from the coolant distribution unit and the liquid cooled sub-ambient unit; and
a cluster controller to simultaneously control operations of both the coolant distribution unit and the liquid cooled sub-ambient unit based on the return liquid temperature and flowrate, and the sub-ambient unit liquid temperature and flowrate, to maintain a system set-point temperature.

2. The apparatus of claim 1, wherein the first electronic component and the second electronic component are distinct electronic components.

3. The apparatus of claim 1, wherein the first electronic component comprises at least one of a central processing unit, a graphics processing unit, or a dual in-line memory module,
and wherein the second electronic component comprise at least one air cooled component selected from a blade, a rack, and a network switch.

4. The apparatus of claim 1, wherein the coolant distribution unit provides the liquid received from the facility supply source to the liquid cooled cold plates to cool the first electronic component, without first cooling the liquid received from the facility supply source.

5. The apparatus of claim 4, wherein the liquid cooled sub-ambient unit cools the air to the sub-ambient temperature prior to providing the air to cool the second electronic component.

6. The apparatus of claim 1, wherein the liquid cooled sub-ambient unit cools the second electronic component that needs a cooler cooling temperature than the first electronic component, the first electronic component being cooled by the liquid cooled cold plates at a higher temperature than the second electronic component.

7. A method comprising:
liquid cooling a first electronic component of a datacenter using a coolant distribution unit providing liquid at an ambient temperature, the coolant distribution unit having a coolant distribution unit facility liquid return line with a return liquid temperature;
air cooling a second electronic component of the datacenter using a liquid cooled sub-ambient unit providing air at a sub-ambient temperature, using a direct expansion device that provides an air-to-liquid heat exchanger to transfer heat from the air to a refrigerant, the liquid cooled sub-ambient unit having a sub-ambient unit facility liquid return line with a sub-ambient unit liquid temperature;
using a cluster controller to simultaneously control operations of both the coolant distribution unit and the liquid cooled sub-ambient unit based on the return liquid temperature and flowrate, and the sub-ambient unit liquid temperature and flowrate, to maintain a system set-point temperature;
recapturing liquid from the coolant distribution unit and the liquid cooled sub-ambient unit; and
using the recaptured liquid as an energy source for a facility.

8. A system comprising:
a set of electronic devices comprising electronic components;
a coolant distribution unit to:
receive liquid at a first temperature from a facility liquid supply source that distributes liquid inside a facility that houses the electronic devices; and
provide the received liquid, or liquid cooled by the received liquid, to at least one liquid cooled cold plate to cool at least one of the electronic components of the electronic devices, the coolant distribution unit having a coolant distribution unit facility liquid return line with a return liquid temperature;
an air cooling unit to:
receive liquid at the first temperature from the facility liquid supply source;
use the received liquid to cool air to a second temperature lower than the first temperature, using a direct expansion device that provides an air-to-liquid heat exchanger to transfer heat from the air to a refrigerant; and
provide the cooled air to the electronic devices to cool at least some of the second electronic components with the cooled air at the second temperature, the air cooling unit having a sub-ambient unit facility liquid return line with a sub-ambient unit liquid temperature; and
a cluster control unit to simultaneously control operations of both the coolant distribution unit and the air cooling unit based on the return liquid temperature and flowrate and the sub-ambient unit liquid temperature and flowrate, to maintain a system set-point temperature.

9. The system of claim 8,
wherein the air cooling unit is an in-row air cooling unit that is located in a row of IT racks and provides the cooled air to a specific rack in the row.

10. The system of claim 8, wherein the cooled air provided to the set of electronic devices is returned, after extracting heat from the electronic components, to the air cooling unit to be cooled again.

11. The system of claim 8, wherein the system recaptures liquid from the air cooling unit and the coolant distribution unit and uses the recaptured liquid as an energy source for a facility.

12. The system of claim 8, further comprising a dry cooler connected to a facility that houses the electronic components, the dry cooler to release heat into an atmosphere outside of the facility.

13. The system of claim 8, wherein the first temperature is 35 degrees Celsius or greater.

14. The system of claim 8, wherein the coolant distribution unit cools liquid from the at least one liquid cooled cold plate by removing heat from the liquid and redistributing cooled liquid back to the at least one liquid cooled cold plate to continue cooling the first electronic component.

15. The method of claim 7, wherein the coolant distribution unit provides the liquid to cool the first electronic component without first cooling the liquid, the first electronic component being cooled at a higher temperature than the second electronic component is, and wherein the liquid cooled sub-ambient unit cools the air prior to providing the air to cool the second electronic component, the second electronic component needing a cooler cooling temperature than the first electronic component does.

16. The method of claim 7, further comprising providing a dry cooler connected to the facility that houses the datacenter, the dry cooler to release heat into an atmosphere outside of the facility.

17. The method of claim 7, further comprising a liquid supply line to provide one stream of liquid from the facility to the coolant distribution unit and the liquid cooled sub-ambient unit.

18. The method of claim 7, wherein at least one liquid cooled cold plate connected to the coolant distribution unit receives liquid greater than 35 degrees Celsius.

19. The method of claim 7, further comprising one of:

providing liquid in parallel to the coolant distribution unit and the liquid cooled sub-ambient unit via a liquid supply line;

providing the liquid in series to the coolant distribution unit and the liquid cooled sub-ambient unit via a liquid supply line.

\* \* \* \* \*